(12) United States Patent
Domenger et al.

(10) Patent No.: US 11,936,285 B2
(45) Date of Patent: Mar. 19, 2024

(54) SWITCH SYSTEM COMPRISING A CURRENT-LIMITING DEVICE

(71) Applicant: Valeo Equipements Electriques Moteur, Creteil (FR)

(72) Inventors: Laurent Domenger, Creteil (FR); Panagiotis Giannikopoulos, Creteil (FR); Hafid Ihaddaden, Creteil (FR)

(73) Assignee: Valeo Equipements Electriques Moteur, Creteil (FR)

( * ) Notice: Subject to any disclaimer, the term of this patent is extended or adjusted under 35 U.S.C. 154(b) by 323 days.

(21) Appl. No.: 17/415,205

(22) PCT Filed: Dec. 17, 2019

(86) PCT No.: PCT/EP2019/085546
§ 371 (c)(1),
(2) Date: Jun. 17, 2021

(87) PCT Pub. No.: WO2020/127196
PCT Pub. Date: Jun. 25, 2020

(65) Prior Publication Data
US 2022/0077763 A1    Mar. 10, 2022

(30) Foreign Application Priority Data
Dec. 20, 2018 (FR) .................................... 1873516

(51) Int. Cl.
*H02M 1/32* (2007.01)
*H02M 7/5387* (2007.01)
(52) U.S. Cl.
CPC ........... *H02M 1/32* (2013.01); *H02M 7/5387* (2013.01)

(58) Field of Classification Search
CPC .............................. H02M 1/32; H02M 7/5387
See application file for complete search history.

(56) References Cited

U.S. PATENT DOCUMENTS

RE37,778 E     7/2002 Feldtkeller
6,807,042 B2  10/2004 Spampinato et al.
(Continued)

FOREIGN PATENT DOCUMENTS

DE      4429716 C1     2/1996
JP   2009-065485 A     3/2009

OTHER PUBLICATIONS

International Search Report and Written Opinion in corresponding International Application No. PCT/EP2019/085546, dated Feb. 18, 2020 (11 pages).
(Continued)

*Primary Examiner* — Adolf D Berhane

(57) ABSTRACT

The invention relates to a switch system (1) comprising a power line (2) for supplying a charge from a voltage source (+Vbat), said power line having a main switch (Q1) comprising a first main terminal (D) and a second main terminal (S), between which a main current (Ip) is intended to pass, and a control terminal (G) for selectively placing the main switch (Q1) in a closed, open or semi-closed state, the main switch (Q1) in its semi-closed state being equivalent to a variable resistor controlled by the control terminal and connected between the first and the second main terminal, characterized in that the switch system (1) further comprises a current-limiting device (3) designed to, when the main current (Ip) exceeds a maximum current threshold, decrease a control current (Ig) entering the control terminal (G), so as to cause the main switch (Q1) to transition from the closed state to the semi-closed state, so as to limit the main current.

9 Claims, 3 Drawing Sheets

(56) References Cited

U.S. PATENT DOCUMENTS

| | | | |
|---|---|---|---|
| 8,710,873 B2 * | 4/2014 | Barrenscheen | H02M 1/08 327/108 |
| 9,094,006 B2 * | 7/2015 | Gravati | H02M 1/32 |
| 9,634,657 B1 | 4/2017 | Zoels et al. | |

OTHER PUBLICATIONS

Notice of Reasons for Refusal issued in Japanese Patent Application No. 2021-535646, dated Jun. 24, 2022 (9 pages).

* cited by examiner

SWITCH SYSTEM COMPRISING A CURRENT-LIMITING DEVICE

DESCRIPTION

The present invention relates to a switch system comprising a current-limiting device, a switching arm comprising such a switch system and an H-bridge comprising a switching arm according to the invention.

The invention also relates to a voltage converter comprising such a switching arm or such a switch system.

Finally, the invention also relates to an electrical system comprising a rotary electric machine with a coiled rotor controlled by such a voltage converter.

Electrical systems are known that comprise a rotary electric machine for a motor vehicle, with this rotary electric machine comprising a coiled rotor. Such a rotary electric machine can be an alternator comprising only one alternator mode or a starter-alternator comprising a motor mode and an alternator mode.

In the motor mode or the alternator mode, the excitation coil of the rotor is supplied with current by a voltage converter of the H-bridge type comprising electronic switches, for example, transistors, in particular metal oxide gate field effect transistors, also known as MOSFET transistors.

It is known that the voltage converters controlling a rotor can be the source of permanent or temporary overcurrents, for example, when the coil of the rotor is faulty. Thus, a temporary overcurrent can occur when, for example, chips, in particular copper, connect two electrical elements with a different potential, for example, the input and the output of the rotor. A motor vehicle battery also can be the source of overcurrents inside the voltage converter.

An overcurrent is a current for which the value exceeds a safety threshold that is defined as the product of the maximum operational current intensity multiplied by a coefficient. The maximum operational current intensity is the maximum current intensity value that can be supported by the most fragile electronic component upstream or downstream of the coil of the rotor in a normal operating mode. Beyond this threshold, electronic components of the converter or of other equipment of the vehicle therefore can be damaged.

Therefore, such overvoltages need to be detected and, if applicable, the most fragile components need to be safeguarded, in particular the electronic switches of the voltage converter.

To this end, a switch system is known from the prior art that comprises a power line for supplying a rotor from a voltage source, said power line comprising a main switch having a first main terminal and a second main terminal, between which a main current Ip is intended to pass, and a control terminal, controlled by a control device, for selectively placing the main switch in a closed or open state, characterized in that the current circulating in the main power line is measured by a Hall effect sensor, and in that the main switch is open when the intensity of the current measured by the Hall effect sensor exceeds a safety threshold.

This simple method of the prior art allows the most fragile components to be protected, in particular the switches of the voltage converter, by opening the main switch, which cuts-off the current in the main power line.

However, excessive time can elapse before the main switch opens, since the reaction time (particularly associated with the latency of the Hall effect sensor and of the system for controlling the switch) of such a system, when the switch is a MOSFET, typically is approximately a dozen µs, whereas the overcurrent can reach several hundred amperes in less than 3 µs. These current levels that are reached after 3 µs are incompatible with the "Safe Operating Area" (SOA) of the MOSFET.

The aim of the invention is to at least partly overcome this disadvantage.

To this end, the invention relates to, according to a first aspect, a switch system comprising:
a. a power line for supplying a charge from a voltage source, said power line comprising;
b. a main switch comprising:
  i. a first main terminal and a second main terminal, between which a main current is intended to pass; and
  ii. a control terminal for selectively placing the main switch in a closed, open or semi-closed state, the main switch in its semi-closed state being equivalent to a variable resistor controlled by the control terminal and connected between the first and the second main terminal;

wherein the switch system further comprises a current-limiting device designed to, when the main current exceeds a maximum current threshold, decrease a control current entering the control terminal, so as to cause the main switch to transition from the closed state to the semi-closed state, so as to limit the main current.

This switch system is noteworthy in that it allows the main current to be limited more quickly than the known switch systems of the prior art. Indeed, the current-limiting device enables a quick reaction by reducing the control current entering the control terminal, so as to place the switch in a semi-closed state, without using the control circuit of the switch.

The switch system according to the invention can also have one or more of the following features, considered individually or in all the technically possible combinations.

In a particular embodiment of the invention, the value of the variable resistance of the main switch in the semi-closed state is regulated in order to limit the main current to the maximum current threshold.

In a particular embodiment of the invention, the power line further comprises a measurement resistor, through which the main current passes, and wherein the current-limiting device comprises a first and a second terminal, said measurement resistor being connected between the first and the second terminal, and in that the current-limiting device is designed to vary the reduction in the control current as a function of a resistance voltage between the first and the second terminal in order to place the main switch in the semi-closed position when the resistance voltage exceeds a threshold voltage.

In a particular embodiment of the invention, the current-limiting device further comprises:
a. a control line comprising a control output connected to the control terminal of the main switch, a control input and a control resistor electrically connected between the control input and the control output, the control resistor being arranged to be passed through by a setpoint current;
b. a first and a second matched transistor each having a current input terminal, a current output terminal and a control terminal:
  i. the control terminals of said first and second transistors and the current input terminal of the second transistor being directly connected together;

ii. the output terminal of the first transistor being directly connected to the second terminal of the current-limiting device, and the output terminal of the second transistor being directly connected to the first terminal of the current-limiting device, so that the voltage between the control terminal of the first transistor and the second terminal of the current-limiting device is equal to the sum of the voltage at the terminals of the measurement resistor of the power line and of the voltage between the control terminal of the second transistor and the first terminal of the current-limiting device; and iii. the input terminal of the first transistor is connected to the control output in order to shunt a shunt current from the setpoint current passing through the control resistor, in order to decrease the control current entering the control terminal;

iv. the input terminal of the second transistor is connected to the input of the control line, between the control input and the control resistor.

Matched transistors are, as is known to a person skilled in the art, transistors with the same technical features and that are most often located in the same housing.

In a particular embodiment of the invention, the first and the second transistor are NPN type bipolar transistors.

In a particular embodiment of the invention, the current limiting device further comprises:
a. a bias resistor connected between the control output and the current input terminal of the first transistor;
b. a bias transistor comprising a current input terminal electrically connected to the control output, a current output terminal and a control terminal;
c. a collector resistor mounted between the second terminal of the current-limiting device and the output terminal of the third transistor;
d. a connection resistor connected by a first terminal to the current input terminal of the first transistor and by a second terminal to the control terminal of the bias transistor;
e. a capacitor connected to the second terminal of the current-limiting device and to the second terminal of the connection resistor.

In a particular embodiment of the invention, the bias transistor Q5 is a PNP bipolar transistor.

In a particular embodiment of the invention, the main switch is a power transistor, preferably a Metal Oxide Semiconductor Field Effect Transistor.

A further aim of the invention, according to a second aspect, is a switching arm comprising a high-side switch and a low-side switch, the two switches being connected together at a center tap, and wherein at least one of the two switches, preferably the high-side switch, is included in a switch system according to the invention.

A further aim of the invention, according to a third aspect, is an H-bridge comprising at least one switching arm according to the second aspect of the invention.

A further aim of the invention, according to a fourth aspect, is a voltage converter comprising a switch system according to the first aspect of the invention or at least one switching arm according to the second aspect of the invention.

A further aim of the invention, according to a fifth aspect, is an electrical system comprising:
a. a voltage converter comprising a switching arm according to the second aspect of the invention;
b. a rotary electric machine comprising a rotor comprising an excitation coil, said excitation coil being connected by one of its terminals to the center tap of said at least one switching arm.

Further features and advantages of the invention will become clearly apparent from the following description, which is provided by way of a non-limiting example, with reference to the accompanying drawings, in which:

BRIEF DESCRIPTION OF THE DRAWINGS:

For greater clarity, identical or similar elements are identified using identical reference signs throughout the figures.

DETAILED DESCRIPTION

Figure 1:
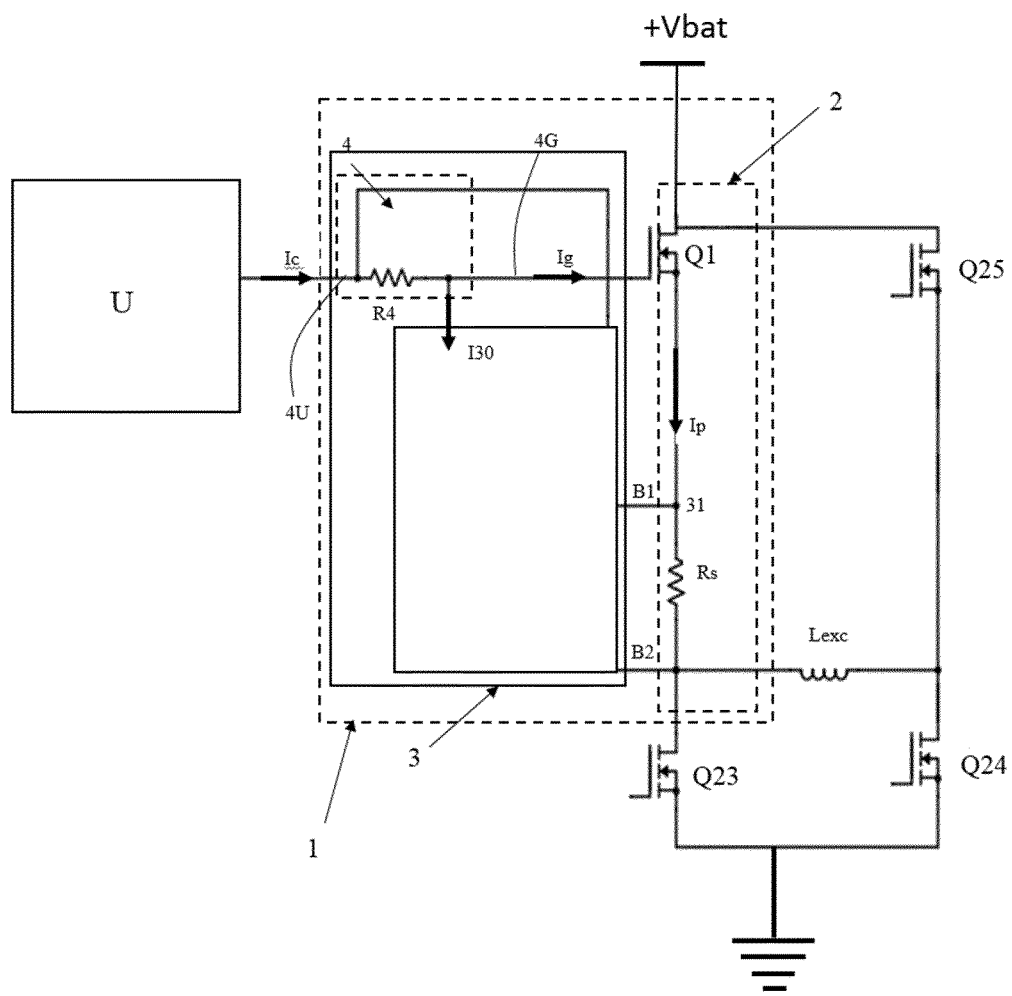
FIG. 1 shows a block diagram of a switch system according to a first embodiment.

FIG. 1 shows an electrical block diagram of a switch system 1 according to a first embodiment connected to a charge, in this case an excitation coil Lexc of a rotor.

The switch system 1 comprises a power line 2, shown by a dashed line rectangle in FIG. 1. The power line 2 allows the excitation coil Lexc to be supplied from a voltage source, in this case a direct voltage source +Vbat.

The power line 2 comprises a main switch Q1 having a first main terminal D and a second main terminal S, between which a main current Ip is intended to pass.

The main switch Q1 further comprises a control terminal G for selectively placing the main switch Q1 in a closed, open or semi-closed state. In its semi-closed state the main switch Q1 is equivalent to a variable resistor connected between the first D and the second main terminal S controlled by the control terminal G.

In the example described herein, the excitation coil Lexc is supplied by an H-bridge comprising a first and a second switching arm mounted in parallel between a ground and the direct voltage source +Vbat. Each of the switching arms comprises a high-side switch and a low-side switch connected together at a center tap, the center tap of each of the two arms of the H-bridge is connected to a different end of the excitation coil Lexc.

In the example described herein, the main switch Q1 is the high-side switch of the first switching arm and all the switches of the H-bridge are metal oxide gate field effect transistors, also known as MOSFET transistors. This example also includes N-type enhancement MOSFET transistors.

In other words, the first switching arm comprises a low-side switch, i.e. a MOSFET Q23, the source of which is connected to the ground and the drain of which is connected to the center tap 31 of the first arm. The drain of the MOSFET Q1 is connected to the direct supply source +Vbat and the source of the MOSFET Q1 is connected to the center tap 31.

The second switching arm comprises a high-side switch Q25 and a low-side switch, i.e. a MOSFET Q24, the source of which is connected to the ground and the drain of which is connected to the center tap of the second switching arm. As an alternative embodiment, the high-side switch can be replaced by a diode, the cathode of which is connected to the direct supply source +Vbat.

The low-side switch Q23 allows, with the low-side switch Q24, controlled demagnetization of the excitation coil Lexc when the main switch Q1 is open.

The switch system 1 further comprises a current-limiting device 3, shown by a rectangle in FIG. 1.

The current-limiting device 3 comprises a control line 4 connected between a control unit U and the control terminal of the main switch Q1, i.e. the gate of the MOSFET Q1.

More specifically, the control line 4 comprises a control output 4G connected to the control terminal G of the main switch Q1 and a control input 4U connected to the control unit U.

The switch Q1 is thus controlled by the control unit U, better known as "driver", which applies a control voltage to the terminal 4U allowing the main switch Q1 to be placed in a closed, open or semi-closed state depending on the resulting voltage at the terminal 4G.

The control line 4 further comprises a control resistor R4 connected between the control input 4U and the control output 4G.

The current-limiting device 3 is also designed to, when the main current Ip exceeds a maximum current threshold, decrease a control current Ig entering the control terminal G of the main switch Q1, so as to cause the main switch Q1 to transition from the closed state to the semi-closed state, so as to limit the main current Ip.

In other words, the current-limiting device 3 is arranged to shunt a shunt current 130 from the current passing through the control resistor R4.

In other words, the MOSFET Q1 transitions from the closed state to a semi-closed state, i.e. the MOSFET Q1 transitions from the on-state to a linear mode operating area.

Thus, the value of the variable resistance of the main switch Q1 in linear mode is regulated as a function of the control current Ig entering the control terminal G.

Thus, the current-limiting device 3 regulates the control current Ig in order to limit the main current Ip to the first threshold.

Such a switch system 1 therefore allows the main current Ip in the supply line 2 to be limited by modulating the resistance of the supply line 2.

The maximum current threshold value is, for example, selected to correspond to the maximum current that can be supported by one of the components in the supply line 2. In the example described herein, the maximum current threshold value is 40 A.

The supply line 2 further comprises a measurement resistor Rs, through which the main current Ip passes. In the example described herein, the measurement resistor Rs is connected between the source of the MOSFET Q1 and the center tap 31.

In the example described herein, the measurement resistor Rs has a value of 2 mΩ.

The current-limiting device 3 further comprises a first terminal B1 and a second terminal B2. The current-limiting device 3 is thus connected parallel to the measurement resistor Rs by means of these two terminals B1 and B2.

In other words, in this embodiment, the current-limiting device 3 is designed to vary the control current Ig as a function of the voltage Vrs measured at the terminal of the resistor Rs, i.e. the voltage measured between the first B1 and the second B2 terminal, when this measured voltage exceeds a threshold voltage value. The threshold voltage value corresponds to the product of the value of the measurement resistance Rs multiplied by the first maximum current threshold value.

Figure 2:
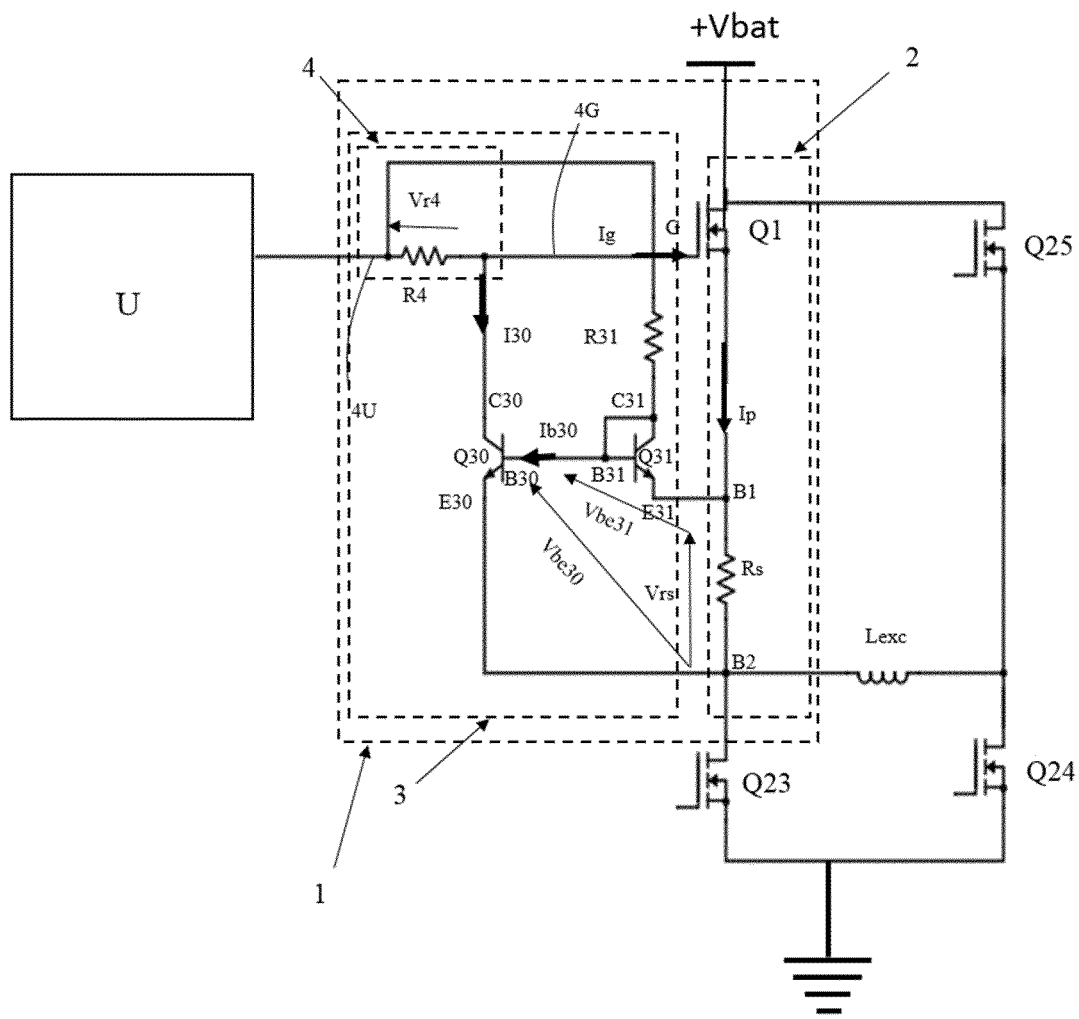
FIG. 2 shows an electrical diagram of a switch system according to a first embodiment.

With reference to FIG. 2, the current-limiting device 3 in the first embodiment of the invention will now be described in further detail.

In this embodiment of the invention, the current-limiting device 3 comprises a first Q30 and a second Q31 matched transistor, each having a current input terminal, a current output terminal and a control terminal.

In the example described herein, the transistors Q30 and Q31 are NPN type bipolar transistors.

The first transistor Q30 comprises a control terminal B30, in this case its base, connected to the control terminal B31, in this case the base, of the second transistor Q31. Furthermore, the base of the second transistor Q31 is connected to the current input terminal C31, in this case the collector, of the second transistor Q31.

The three terminals B31, B30 and C31 therefore have the same potential.

The output terminal E30, in this case the emitter, of the first transistor Q30 is connected to the second terminal B2 of the current-limiting device 3.

The output terminal E31, in this case the emitter, of the second transistor Q31 is connected to the first terminal B1 of the current-limiting device 3.

Thus, the voltage Vbe30 between the control terminal B30 and the terminal E30 of the first transistor Q30 is equal to the sum of the voltage Vrs and of the voltage Vbe31 between the control terminal B31 and the terminal E31 of the second transistor Q31. In other words, the voltage Vbe30 and the voltage Vbe31 have the same control potential and the difference between these two voltages corresponds to the voltage Vrs, which is proportionate to the main current Ip. Thus, the resistance voltage Vrs equals the voltage between the control and output terminals of the first transistor Q30, less the voltage between the output and control terminals of the second transistor, in accordance with the following equation [Math. 1].

$$Vrs = Vbe30 - Vbe31 \qquad \text{[Math. 1]}$$

The input terminal C30, in this case the collector, of the first transistor Q30 is connected to the output 4G of the control line 4. In this case, in this example, the input terminal C30 is directly connected to the output 4G. In other words, the output terminal 4G, the control terminal G of the switch Q1 and the input C30 have the same potential.

The first transistor Q30 is arranged to shunt a shunt current 130 from the current passing through the control resistor R4.

The input terminal C31 of the second transistor Q31 is connected to the input 4U of the control line 4 by means of a first bias resistor R31. In other words, the first bias resistor R31 is connected, by one of its terminals, to the control terminal 4U and, by the other one of its terminals, to the input terminal C31 of the second transistor Q31.

The design of the current-limiting device 3 implies that the main current confirms the equation [Math. 2].

$$Ip = (Vbe30 - Vbe31)/Rs \qquad \text{[Math. 2]}$$

Therefore, the limitation of the main current depends on the biasing points of the first Q30 and of the second Q31 transistor and on the resistance Rs.

After selecting the resistance Rs, the biasing points of the two transistors define the value at which the main current will be limited.

The first transistor Q30 operates in linear mode and is biased with a collector current 130 that is equal, in accordance with the equation [Math. 3], to the voltage Vu applied by the control unit U to the control input 4U, less the voltage Vce30 between the emitter and the collector of the first transistor Q30 and divided by the value of the control resistance R4. The biasing point of the first transistor Q30 also depends on the transconductance of the main transistor Q1, on the value of the measurement resistance Rs and on the value of the control resistance R4.

$$I30 = \frac{Vu - Vce30}{R4} \qquad \text{[Math. 3]}$$

The second transistor Q31 is also biased, so that this second transistor operates in linear mode. With the collector and the base of the second transistor Q31 being connected together, the voltage between the emitter and the collector and the voltage between the base and the emitter of the second transistor Q31 is equal, of the order of 0.6 V in the example described herein. The second transistor Q31 is biased with a collector current Ic31 that is equal, in accordance with the equation [Math. 4], to the voltage Vu applied by the control unit U to the control input 4U, divided by the value of the first biasing resistance R31. In the example described herein, the collector current is approximately 250 µA. Thus, the selection of the value of the first biasing resistance R31 depends on the desired biasing point for the second transistor Q31.

$$Ic31 = \frac{Vu}{R31} \qquad \text{[Math. 4]}$$

With the two transistors Q30 and Q31 being matched, the higher the voltage Vrs, the lower the apparent resistance between the emitter and the collector of the first transistor Q30, and therefore the more the shunt current I30 increases.

The selection of the value of the measurement resistance Rs is the result of a compromise between the losses in the measurement resistance Rs and the sensitivity of the first Q30 and of the second Q31 matched transistor on their parameter Vbe. A measurement resistance Rs is required that is low enough so as not to generate excessive losses and that at the same time is big enough to cause a high enough voltage drop between its terminals to allow shunting of the current I30 in order to limit the current Ip, with said reduction in the current Ip being caused as a result of the reduction in the voltage between the gate and the source of the transistor Q1 caused by the voltage drop at the terminals of the control resistor R4.

The voltage at the input 4U is equal to the sum of the voltage Vr4 at the terminals of the control resistor R4, of the voltage Vgs between the control terminal G and the output S of the transistor Q1 and of the voltage Vrs.

Thus, the matched transistors Q30, Q31, the measurement resistor Rs and the first bias resistor R31 are selected as a function of the first desired threshold, the control resistance R4 and the features of the main switch Q1, particularly as a function of its linear mode operating features.

Therefore, such a switch system 1 allows the control current Ig entering the control input G to be reduced by shunting, at the output of the control resistor R4, a current I30 that is higher the higher the voltage at the terminals of the measurement resistor Rs.

Figure 3:
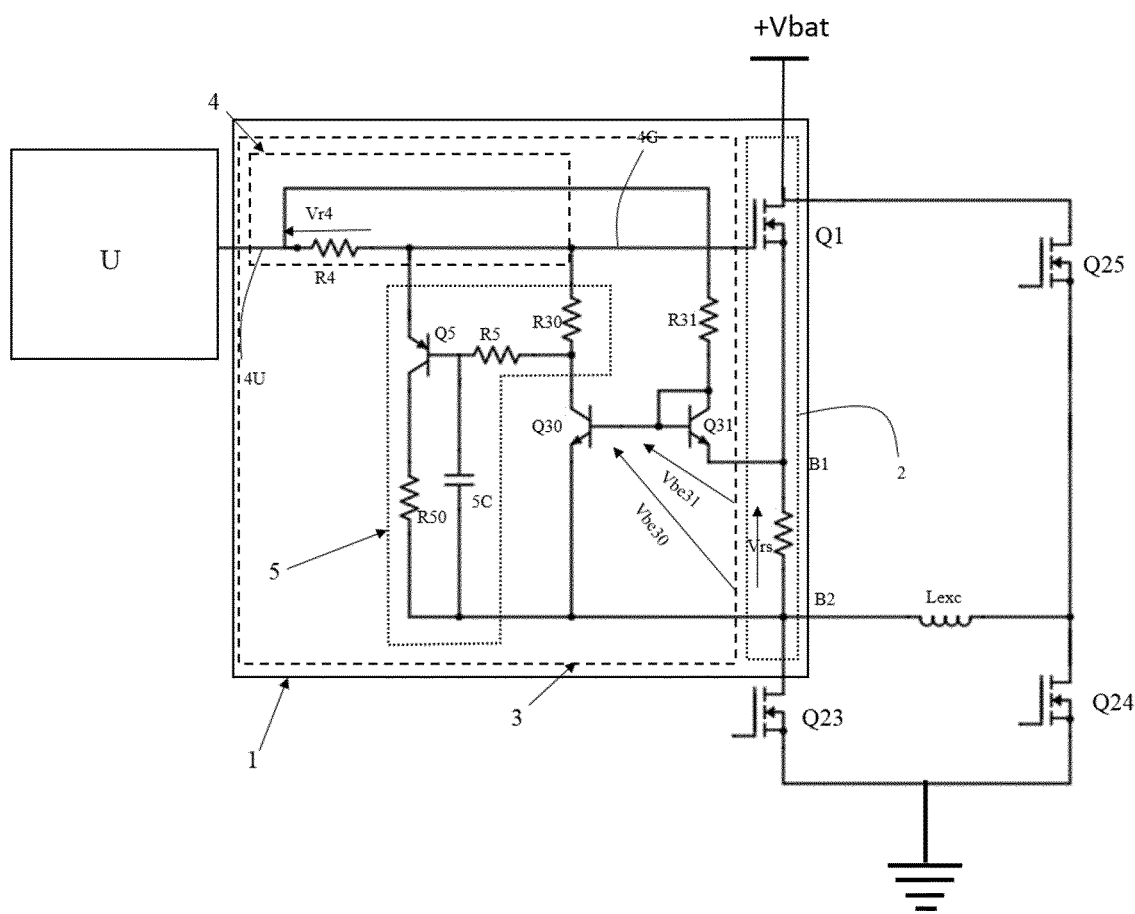
FIG. 3 shows an electrical diagram of a switch system according to a second embodiment.

With reference to FIG. 3, the current-limiting device 3 will now be described in further detail in a second embodiment of the invention that is identical to the first embodiment, except in that it further comprises a bias circuit 5.

This bias circuit 5 comprises:
1. a second bias resistor R30;
2. a connection resistor R5;
3. a bias transistor Q5, in this case a PNP bipolar transistor, comprising a current input terminal E5, a current output terminal C5 and a control terminal B5;
4. a collector resistor R50; and
5. a capacitor 5C.

In the example described herein, the current input terminal E5 is the emitter of the transistor Q5, the current output terminal C5 is the collector of the transistor Q5 and the control terminal B5 is the base of the transistor Q5.

The second bias resistor R30 is connected between the output 4G of the control line and the input C30 of the first transistor Q30. In other words, the second bias resistor R30 electrically connects the input C30 to the control output 4G.

The emitter E5 of the bias transistor Q5 is connected to the control output 4G of the control line 4, and the collector C5 is connected, by means of the collector resistor R50, to the second input terminal B2 of the current-limiting device 3.

The control terminal of the bias transistor Q5 is also connected to the second input terminal B2 of the current-limiting device 3 by means of a capacitor 5C and to the terminal C30 of the first transistor Q30 by means of the connection resistor R5.

Of course, the invention is not limited to the embodiments described with reference to the figures, and alternative embodiments can be contemplated without departing from the scope of the invention.

For example, in the previously described embodiments, the main transistor Q1 is a MOSFET transistor. As an alternative embodiment, this transistor can be an Insulated Gate Bipolar Transistor (IGBT).

The invention claimed is:

1. A switch system comprising:
a power line for supplying a charge from a voltage source, said power line comprising:
a main switch comprising a first main terminal and a second main terminal, between which a main current is intended to pass, and
a control terminal for selectively placing the main switch in a closed, open or semi-closed state, the main switch in the semi-closed state being equivalent to a variable resistor controlled by the control terminal and connected between the first and the second main terminal; and
a current-limiting device configured to, when the main current exceeds a maximum current threshold, decrease a control current entering the control terminal, so as to cause the main switch to transition from the closed state to the semi-closed state, so as to limit the main current, wherein the power line further comprises a measurement resistor, through which the main current passes, and
wherein the current-limiting device comprises a first and a second terminal, said measurement resistor being connected between the first and the second terminal, and the current-limiting device is configured to vary the reduction in the control current as a function of a resistance voltage between the first and the second terminal, in order to place the main switch in the semi-closed position when the resistance voltage exceeds a threshold voltage.

2. The switch system as claimed in claim 1, wherein the value of the variable resistance of the main switch in the semi-closed state is regulated in order to limit the main current to the maximum current threshold.

3. The switch system as claimed in claim 1, wherein the current-limiting device comprises:
- a control line comprising a control output connected to the control terminal of the main switch, a control input and a control resistor electrically connected between the control input and the control output, the control resistor being arranged to be passed through by a setpoint current;
- a first and a second matched transistor each having a current input terminal, a current output terminal and a control terminal:
  - the control terminals of said first and second transistors and the current input terminal of the second transistor being directly connected together;
  - the output terminal of the first transistor being directly connected to the second terminal of the current-limiting device, and the output terminal of the second transistor being directly connected to the first terminal of the current-limiting device, so that the voltage between the control terminal of the first transistor and the second terminal of the current-limiting device is equal to the sum of the voltage at the terminals of the measurement resistor of the power line and of the voltage between the control terminal of the second transistor and the first terminal of the current-limiting device; and
  - the input terminal of the first transistor is connected to the control output to shunt a shunt current from the setpoint current passing through the control resistor, in order to decrease the control current entering the control terminal;
  - the input terminal of the second transistor is connected by means of a first bias resistor to the input of the control line.

4. The switch system as claimed in claim 3, wherein the current-limiting device further comprises:
- a second bias resistor connected between the control output and the current input terminal of the first transistor;
- a bias transistor comprising a current input terminal electrically connected to the control output, a current output terminal and a control terminal;
- a collector resistor mounted between the second terminal of the current-limiting device and the output terminal of the third transistor;
- a connection resistor connected by a first terminal to the current input terminal of the first transistor and by a second terminal to the control terminal of the bias transistor;
- a capacitor connected to the second terminal of the current-limiting device and to the second terminal of the connection resistor.

5. The switch system as claimed in claim 1, wherein the main switch is a Metal Oxide Semiconductor Field Effect Transistor.

6. A switching arm comprising a high-side switch and a low-side switch, the two switches being connected together at a center tap, and wherein at least one of the two switches is included in a switch system as claimed in claim 1.

7. An H-bridge comprising at least one switching arm as claimed in claim 6.

8. A voltage converter comprising: at least one switch system as claimed in claim 1; and a switching arm comprising a high-side switch and a low-side switch, the two switches being connected together at a center tap, wherein at least one of the two switches is part of the switch system.

9. An electrical system comprising:
- a voltage converter comprising a switching arm as claimed in claim 6; and
- a rotary electric machine comprising a rotor comprising an excitation coil, said excitation coil being connected by one of its terminals to the center tap of said at least one switching arm.

\* \* \* \* \*